(12) United States Patent
Hellums et al.

(10) Patent No.: US 6,384,664 B1
(45) Date of Patent: May 7, 2002

(54) DIFFERENTIAL VOLTAGE SENSE CIRCUIT TO DETECT THE STATE OF A CMOS PROCESS COMPATIBLE FUSES AT LOW POWER SUPPLY VOLTAGES

(75) Inventors: James R. Hellums; Heng-Chih (Jerry) Lin, both of Plano; Baher Haroun, Allen, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/680,811

(22) Filed: Oct. 5, 2000

(51) Int. Cl.$^7$ ............................................... H01H 85/00
(52) U.S. Cl. ........................................ 327/525; 327/526
(58) Field of Search ................................. 327/525, 526; 365/96, 185.14, 225.7; 257/529

(56) References Cited

U.S. PATENT DOCUMENTS 5,404,049 A * 4/1995 Canada et al. ............... 327/525
5,487,037 A * 1/1996 Lee ......................... 365/189.11
5,536,968 A * 7/1996 Crafts et al. ................. 257/529
5,731,733 A * 3/1998 Denham ...................... 327/525
5,976,943 A * 11/1999 Mantley et al. .............. 438/382
6,091,273 A * 7/2000 Bernstein et al. ............ 327/321

* cited by examiner

Primary Examiner—Matthew Smith
Assistant Examiner—Paul Dinh
(74) Attorney, Agent, or Firm—Dwight N. Holmbo; Wade James Brady, III; Frederick J. Telecky, Jr.

(57) ABSTRACT

A differential voltage sense circuit has a fuse placed in one upper leg of a resistance bridge while the remaining upper leg (sense leg) employs a resistor constructed of doped poly or poly silicide or constructed of the doped silicon that forms the N-well or P-well in CMOS process. The lower legs each have a switch selected from a pair of matched switches. A comparator, latch and combinational logic sense the state of the fuse in the resistance bridge and latch the state information before the switches can operate to stop the flow of current in the resistance bridge. The differential voltage sense circuit can operate at low voltage levels compatible with advanced CMOS processes.

71 Claims, 4 Drawing Sheets

US 6,384,664 B1

DIFFERENTIAL VOLTAGE SENSE CIRCUIT TO DETECT THE STATE OF A CMOS PROCESS COMPATIBLE FUSES AT LOW POWER SUPPLY VOLTAGES

BACKGROUND OF THE INVENTION

1. Field of the Invention

This invention relates generally to differential fuse sensing circuits, and more particularly to a differential voltage sense circuit to detect the state of a CMOS process compatible (e.g., silicide poly, doped poly, metal) fuse at low power supply voltages. The state of the fuse can be either blown (e.g., open or resistance greater than 1 M Ω) or not blown (e.g., short or resistance less than 100 Ω).

2. Description of the Prior Art

In the fabrication of electrical circuits, especially those formed in semiconductor integrated circuits, a non-volatile memory element is necessary to retain stored information when the power to the device is turned off. Non-volatile memory has traditionally been ROM, ePROM, and eePROM. ROM is not general because it requires mask level programming at the factor. Memory made from ePROM or eePROM are very general purpose but require additional special process steps to have this storage element. Also, in the latest CMOS processes, the gate oxides are so thin that the charge used to store the bit can leak (tunnel) out. Fuses are another type of non-volatile memory which do not require any special process additions. There are two types of fuse; laser fuses (usually metal links that are zapped by a laser to open them at the factory before packaging), and the type considered for this invention called poly fuses (even though the fuse material may be metal or silicide poly, etc.) which can be programmed once in the package.

Applications where poly fuses are used include chip ID, repair of large SRAM's by enabling redundant rows or columns, or trimming the process variations out of resistors and/or capacitors to make precise components used in analog-to-digital (A/D) and digital-to-analog (D/A) converters. For instance, a fuse may be used to selectively connect additional elements to create the desired output for an analog circuit needing more precision than the process is capable of delivering.

Since the fuses are programmed in the package, a transistor decoder is required and the fusing current is limited. As a result, fuses may be only partially blown, i.e., neither open nor short. This ambiguity creates a situation in which indeterminate logic outputs may be created thereby rendering the circuit useless (or at least less useful).

Prior art current sensing circuits can not determine if the fuse is blown at some of the voltage, process and temperature comers at low supply voltages for scaled CMOS processes. This is because known circuit topologies are problematic at low supply voltage and at low current levels. Conventional current sensing circuits use a current subtracter followed by resistive loaded common-source amplifiers to gain up the signal, but the gain is proportional to the supply voltage which means that as the supply voltage is reduced, the gain decreases. This characteristic renders such circuits incapable of functioning over the 0.6V to 2.5V supply voltage range of advanced CMOS processes (e.g., deep sub-micron processes such as the 0.13 um or 0.10 um technology nodes and beyond).

In view of the foregoing, a need exists for a voltage sense circuit that is capable of detecting the state of a CMOS process compatible (e.g., silicide poly, doped poly, metal) fuse at low power supply voltages.

SUMMARY OF THE INVENTION

The present invention is directed to a differential voltage sense circuit to determine the state of CMOS process compatible (e.g., silicide poly) fuses at low power supply voltages. The voltage sense circuit uses a differential voltage scheme based on a resistance bridge and differential latch circuit that is designed for low voltage operation. The bridge is very sensitive to changes in the resistance in one arm. This difference is sensed, gained up (amplified) and latched in one circuit.

According to one embodiment, a differential voltage sense circuit comprises a resistance bridge having two upper legs and two lower legs, wherein one upper leg includes a CMOS process compatible fuse and the other upper leg includes a CMOS process compatible resistor, and further wherein each lower leg includes a CMOS process compatible switch selected from a pair of matching switches. The sense circuit further has a comparator that is operative to sense a voltage difference between the two legs where the upper and lower legs are joined together. The sense circuit further has a latch that is operative to latch a voltage having a state determined by the voltage difference and that is indicative of the state of the resistor fuse. The sense circuit further has a combinational element that is operational to prevent the bridge switches from turning off and stopping the flow of current through the resistance bridge until after the fuse state (status) information is latched by the latch.

In one aspect of the invention, a differential voltage sense circuit is implemented that has virtually infinite gain (due to positive feedback) at a desired decision point.

In another aspect of the invention, a differential voltage sense circuit is implemented that is very efficient.

In yet another aspect of the invention, a differential voltage sense circuit is implemented to detect the state of silicide poly fuses at low power supply voltages.

In still another aspect of the invention, a differential voltage sense circuit is implemented that is compatible with advanced CMOS processes.

In still another aspect of the invention, a differential voltage sense circuit is implemented that works for the entire voltage supply range that the CMOS logic gates work, all process corners and about −40° C. to about 125° C. temperatures for all the deep sub-micron processes.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1A:
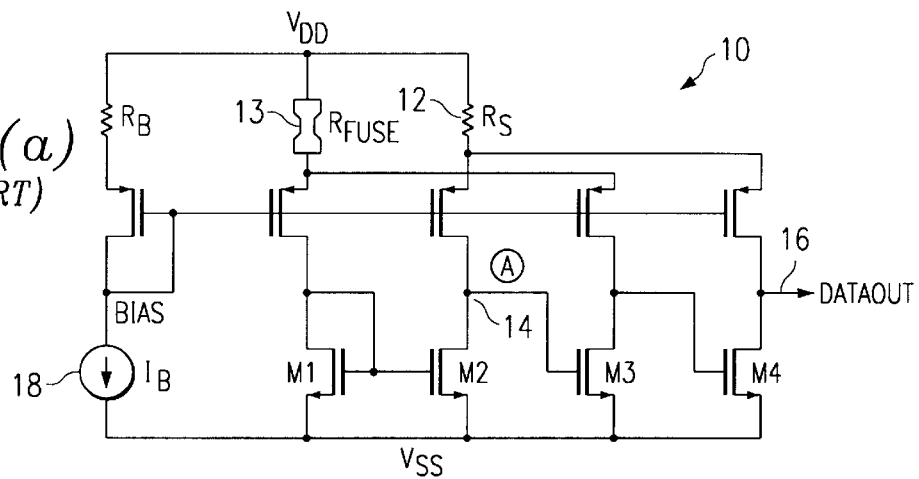
FIG. 1(a) is a schematic diagram illustrating a differential current sensing circuit that is known in the prior art.

FIG. 1(a) illustrates a prior art differential current sensing circuit 10 that senses the difference in a reference current and the fuse current. The current that flows through the sense resistor Rs 12 is differenced (i.e. compared) with the current flowing through the fuse 13, via the current mirror M1–M2 at node 'A' 14. If the fuse 13 is not blown, then its resistance is much less than Rs 12 and the current through the fuse will be much greater so that node 'A' 14 will be pulled near Vss in value. DATAOUT 16 will also be at or near ground (Vss) after node 'A' 14 is gained up by the two common-source amplifiers M3 and M4. When the fuse 13 is blown, then its resistance is much greater than Rs 12 and the current will be very small through the fuse 13 so that node 'A' 14 will pull up to a mid supply voltage level which will be gained up by the two amplifiers, M3 and M4, to get DATAOUT 16 near $V_{DD}$. The circuit shown in FIG. 1(a) is highly accurate since the reference current $I_B$ 18 is mirrored over to the Rs 12 leg as some ratio of $I_B$ 18 which is set by the resistor ratio $R_B$/RS. A problem with this circuit 10 is that it consumes DC power continuously and it requires the extra bias leg and current source $I_B$ 18.

Figure 1B:
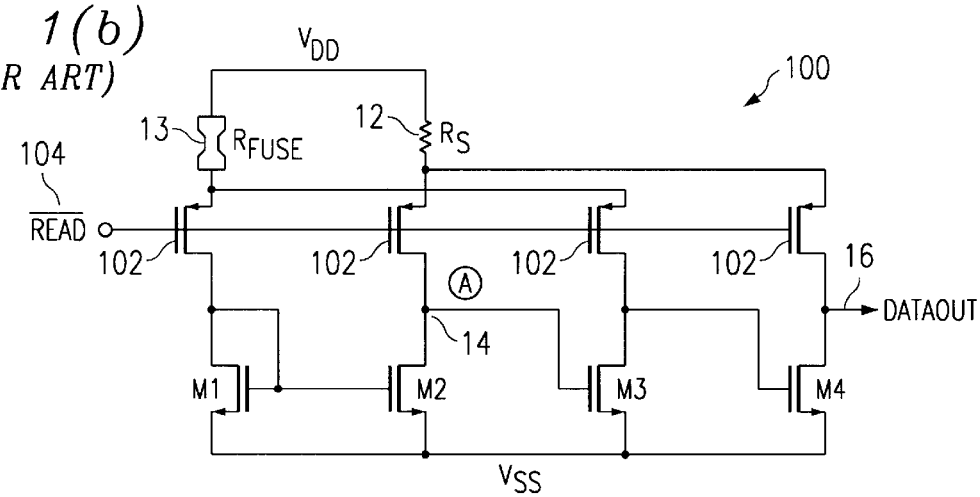
FIG. 1(b) illustrates the differential current sensing circuit depicted in FIG. 1 and that is modified to shut off the DC current path after the fuse cell is read.
Figure 11A:
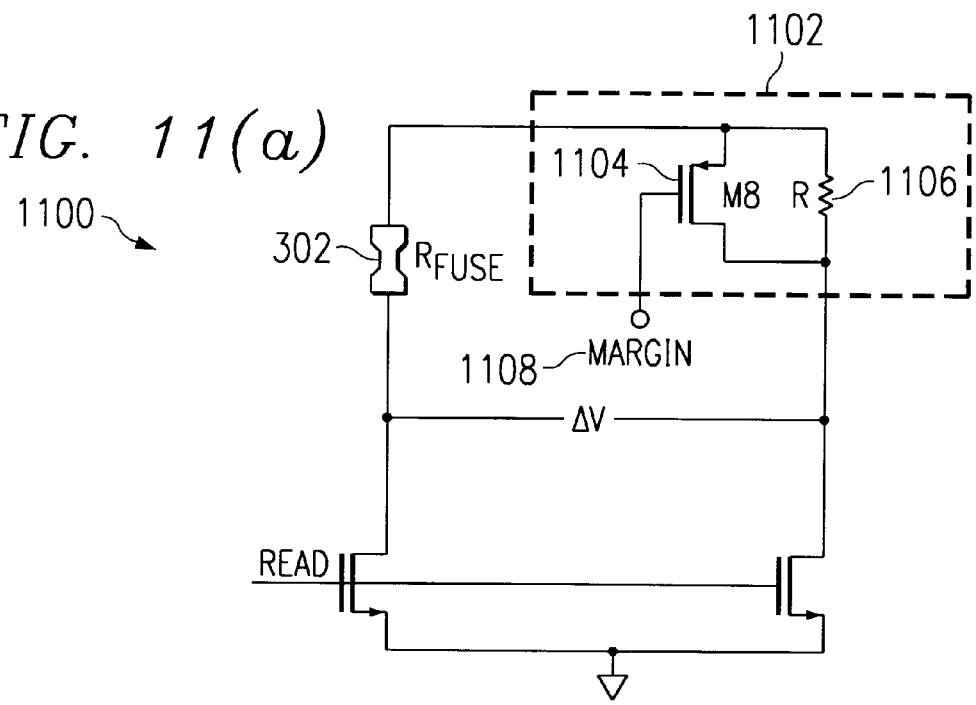
FIG. 11(a) is a schematic diagram illustrating a resistance bridge having a resistance control structure in the sensing leg of the bridge according to another embodiment of the present invention and that is suitable for use with the difference voltage sensing circuit depicted in FIG. 8.
Figure 11B:
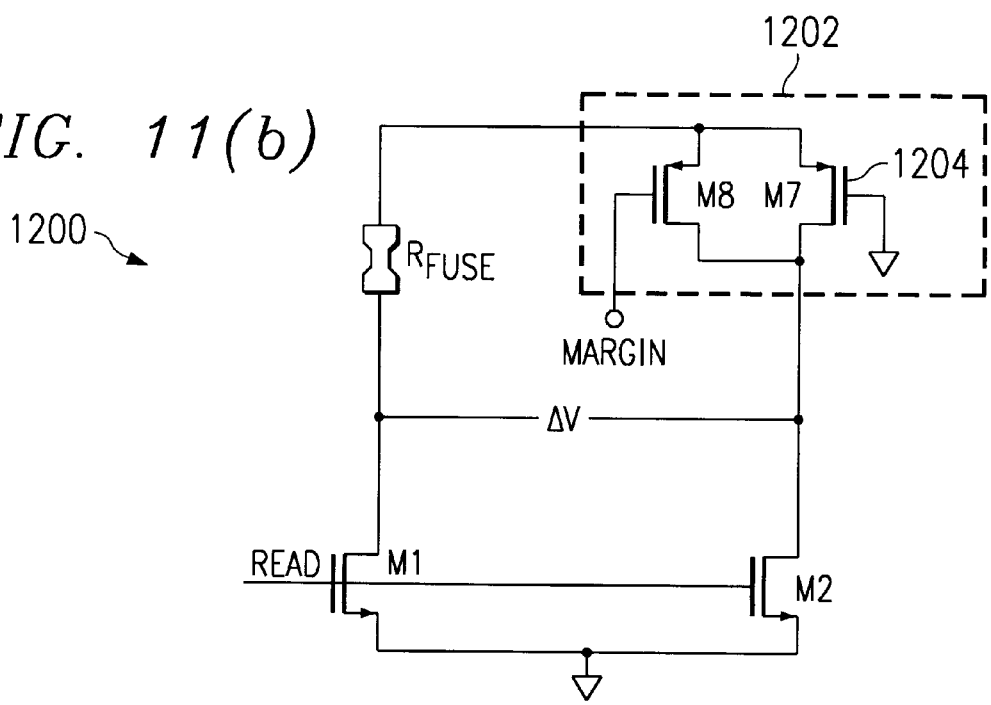
FIG. 11(b) is a schematic diagram illustrating a resistance bridge having yet another resistance control structure in the sensing leg of the bridge according to another embodiment of the present invention and that is suitable for use with the difference voltage sensing circuit depicted in FIG. 8.

The circuit 100 depicted in FIG. 11(b) simplifies the circuit 10 of FIG. 1(a) by eliminating the extra bias leg and current source 18 by making the PMOS transistor gates 102 controlled by a signal $\overline{READ}$ 104. When $\overline{READ}$ 104 control line is low, then the cell 100 will sense the fuse 13 condition since the PMOS transistors will be "ON" and conducting current. The state of the PMOS transistors will be in triode condition and have low resistance if their Width/Length (W/L) ratio is made large. When $\overline{READ}$ 104 is high, then the PMOS transistors are turned "OFF" and no DC current can flow. This is very important in many low power applications. The fuse cell 100 information at DATAOUT 16 however, is lost when $\overline{READ}$ 104 is high; therefore a D-latch is required to follow the fuse cell 100 to hold the information. The circuit 100 shown in FIG. 1(b) was found by the present inventors to work well down to the 2.5V mode, but to be insufficient for 1.5V and 1.2V advanced CMOS technologies. The insufficiencies were attributed substantially to large mismatches in the M1–M2 current mirror, large output conductance variation in the transistors which causes the gain to vary, and the fact that the common-source amplifiers, M3 And M4, are resistively loaded. The voltage gain is defined by Av=$V_{DD}$/Vgst. Since the supply voltage $V_{DD}$ is scaling down to 0.6V for some advanced CMOS processes, the amplifiers, M3 and M4, will therefore have very low gain. Since the gain is low, the decision point to determine a 1) blown or 2) not blown fuse is very indecisive. Node 'A' 14 does not swing very much at low power supply voltage $V_{DD}$ since the delta current is not very large into the gate of M2. This circuit is especially problematic if low current is required in the application such as when a very large number of fuses are used.

Figure 2:
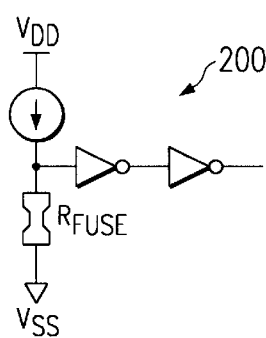
FIG. 2 is a schematic diagram illustrating a prior art single-ended voltage sense circuit.

At such low supply voltages $V_{DD}$, the present inventors discovered it is better to use voltage sensing schemes as contrasted with the current sensing schemes discussed above. Single-ended circuits for voltage sensing are well known in the prior art, and have worked well for voltages between about 7V and about 17V. These prior art circuits however, will not function with 1.5V or 1.2V CMOS technology. One prior art single-ended voltage sense circuit 200 is shown in FIG. 2.

Figure 3:
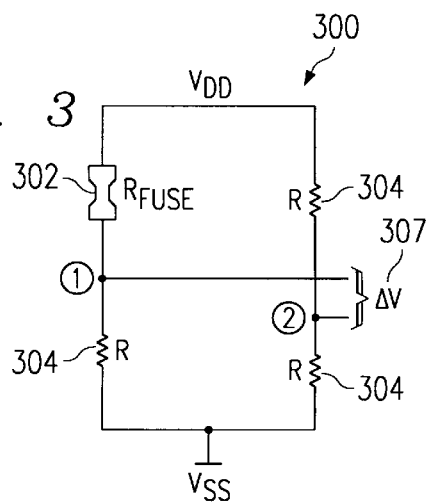
FIG. 3 is a schematic diagram illustrating a resistance bridge where one leg of the bridge comprises a silicide poly fuse.

FIG. 3 is a schematic diagram depicting a resistance bridge 300 where one leg of the bridge 300 comprises a silicide poly fuse 302. If the resistors 304 are all equal and the fuse resistor ($R_{FUSE}$) 302 has a different value, then there will be a delta voltage 307 between nodes '1' and '2'. Then, if Vss=0, $$\Delta V = \left( \frac{R}{R + R_{FUSE}} - \frac{1}{2} \right) V_{DD} \qquad (1)$$

Figure 4:
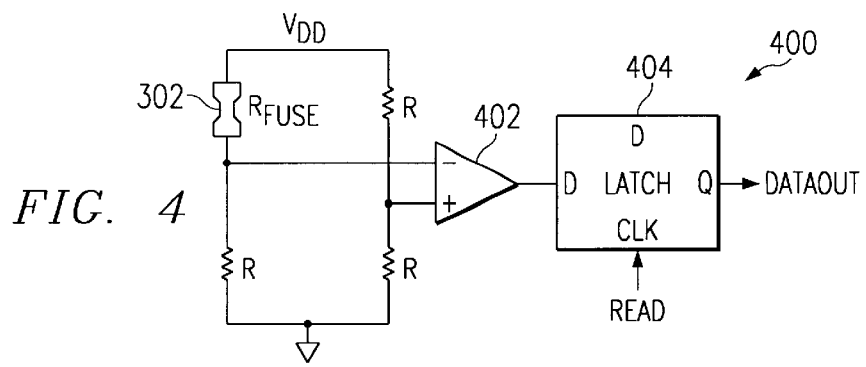
FIG. 4 is a schematic diagram illustrating a difference voltage sensing circuit comprising a resistance bridge with a CMOS process compatible resistor fuse in one upper leg, a difference amplifier and a latch according to one embodiment of the present invention.
Figure 5:
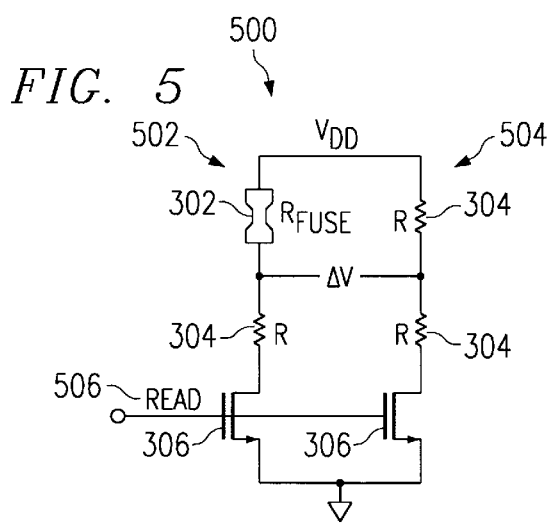
FIG. 5 is a schematic diagram illustrating a resistance bridge according to one embodiment of the present invention and that is suitable for use with the difference voltage sensing circuit depicted in FIG. 4.

The present inventors found the resistance of the silicide poly fuse 302 to be in the range of about 30 Ω–100 Ω if not blown, and usually greater than 1 M Ω when it is blown; but that the resistance can "regrow" to about 200 kΩ where it must still be sensed as a blown fuse. If resistors 304 are chosen to be somewhere between the foregoing extremes, such as 20 kΩ, then the delta voltage 307 is found to be 0.409$V_{DD}$ for a blown fuse 302 and 0.495$V_{DD}$ for a good fuse 302. This then is the magnitude of the delta. The sign of the delta voltage 307 was also found to change from not blown to blown; and this information then is the information that must be logically encoded. This task could be achieved using a differential amplifier 402 and a latch 404 as illustrated in the voltage sensing circuit 400 depicted in FIG. 4. The absolute value of the voltages on nodes '1' and '2' will vary between the $V_{DD}$ and Vss supplies, but this common-mode will be rejected the differential input of the amplifier 402, and only the differential voltage ΔV will be amplified. For actual applications however, DC current should only flow when reading the fuse 302 state and then switch to the no current flow state when the data is latched or stored. This task can be accomplished by using big switches 306 having a small impedance compared to R 304 in series as shown for the voltage sensing bridge circuit 500 depicted in FIG. 5. When the READ logic signal 506 goes high, the cell (fuse) 302 has current flowing and the circuit 500 functions as described herein before; but when READ 506 is low, the NMOS devices 306 are turned off so no current can flow.

Figure 6:
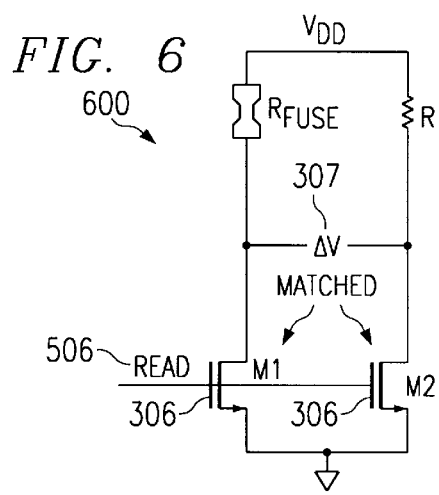
FIG. 6 is a schematic diagram illustrating a resistance bridge according to the most preferred embodiment of the present invention and that is suitable for use with the difference voltage sensing circuit depicted in FIG. 4.

For the circuit 500 to detect the fuse 302 state, the present inventors recognized that it is important that the resistance in both legs 502, 504 of the lower half of the bridge 500 be equal, although they need not be equal to R 304 on the top side of the bridge 500. Triode NMOS devices 306 therefore can be used to act as resistors when "ON" and can be turned "OFF" to stop the current flow when the data has been stored. The voltage sense bridge circuit 600 illustrated in FIG. 6, for example, can be used to achieve the desired goals. According to one embodiment, the NMOS transistors 306 are designed to have a narrow width and a long channel length to act as good resistors when turned "ON" (READ 506 is high). The NMOS transistors 306 most preferably are matched so they have identical electrical characteristics. This feature will reduce the amount of wafer area necessary to implement the circuit 600. It will be appreciated that choosing the size of the two NMOS devices 306 properly will cause the circuit 600 to function in the same manner as the circuit 300 described herein before. It can also be appreciated that any comparator that senses the delta voltage 307 may have to be more sensitive, but the requisite sensitivity can be easily implemented with a well designed comparator.

Figure 7:
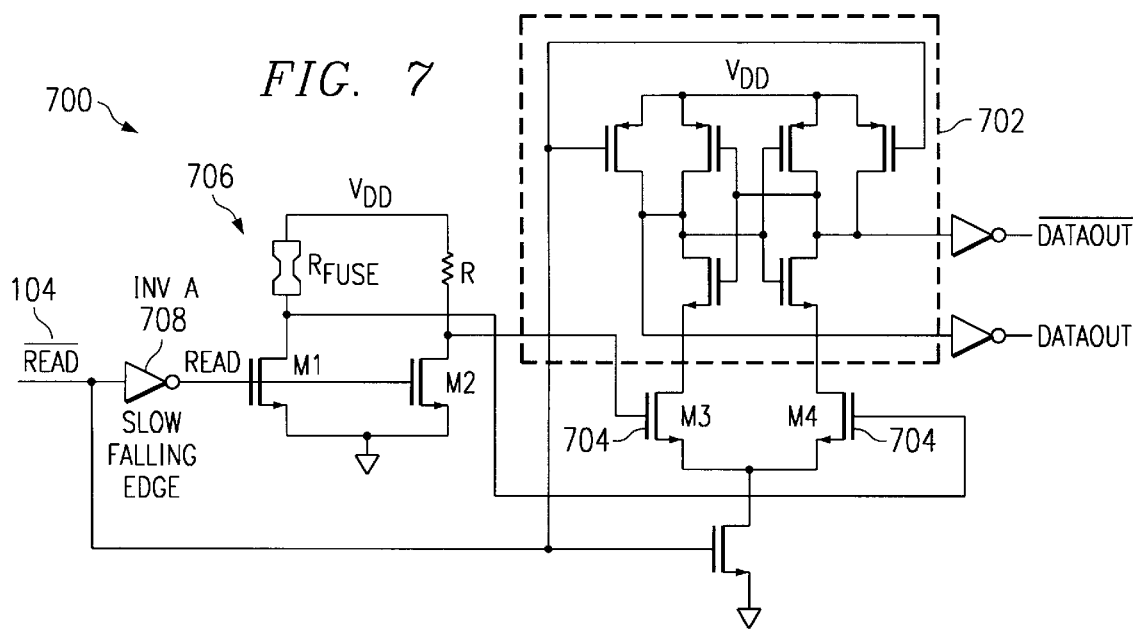
FIG. 7 is a schematic diagram illustrating a difference voltage sensing circuit according to one embodiment of the present invention.

FIG. 7 illustrates a differential voltage sense circuit 700 comprising a very small latch 702 having high gain and that uses very little to no current when in the data holding mode of operation. It can be seen that the latch 702 is embedded into the loads of the comparator input pair 704. When $\overline{\text{READ}}$ 104 is low, the current flows in the bridge and the delta voltage 307 builds up at the input gates of M3 (704) and M4 (704). When $\overline{\text{READ}}$ 104 transitions high, the latching comparator transistors 704 are enabled and operate to amplify the delta voltage 307 until the regenerative latch 702 flips and stores the data. The inverter 708 is required to have a slow falling edge so that the current in the bridge 706 does not stop flowing and destroy the delta voltage 307 before the latch 702 trips.

Figure 8:
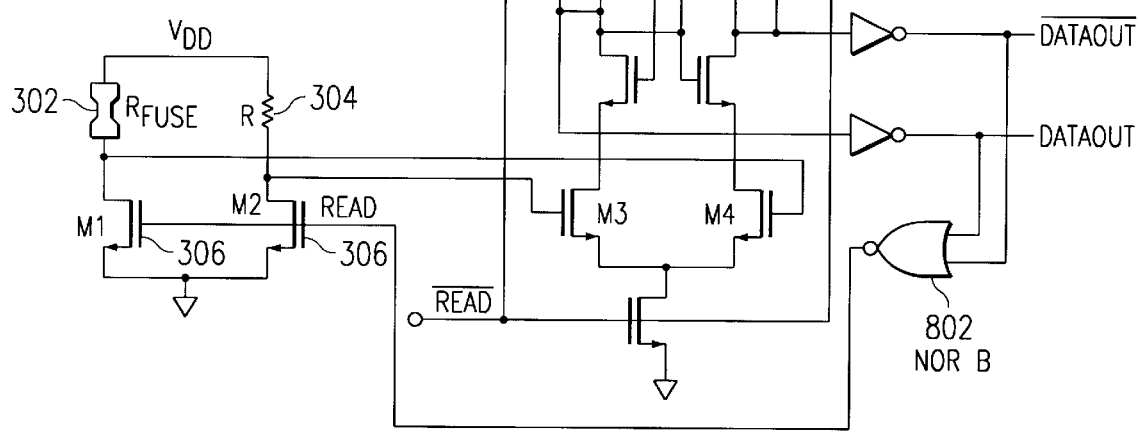
FIG. 8 is a schematic diagram illustrating a difference voltage sensing circuit according to the most preferred embodiment of the present invention.

The present inventors further recognized the possibility of a race condition that can occur with the differential voltage sense circuit 700 under some conditions of temperature, process and supply voltage ranges. These issues are resolved with the differential voltage sense circuit 800 illustrated in FIG. 8. The circuit 800 is guaranteed to latch the data before transistors 306 are turned off by NOR gate 802. The differential voltage sense circuit 800 is considered by the inventors to be the most preferred embodiment of the present invention. It is especially preferred that resistor 304 be constructed of non silicide, doped poly silicon which is the standard gate material in all CMOS processes. Another preferred material for use in a CMOS process comprises the doped silicon that forms the N-well or P-well region, depending on the type of process employed.

Figure 9:
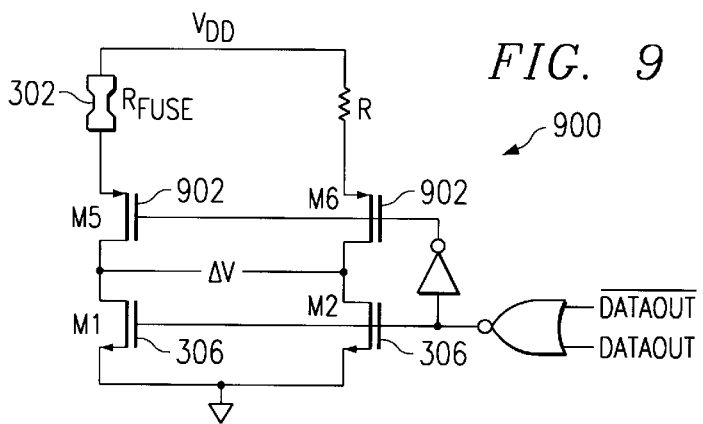
FIG. 9 is a schematic diagram illustrating a resistance bridge that operates to protect damage to the gate oxide of the transistors in the lower leg of the bridge shown in FIG. 8 according to another embodiment of the present invention and that is suitable for use with the difference voltage sensing circuit depicted in FIG. 8.

FIG. 9 illustrates a differential voltage sense circuit resistance bridge 900 that operates to protect damage to the gate oxide of the transistors 306 in the lower leg of the bridge 900 due to the large voltage transition used to blow the fuse. The present inventors recognized that when a fuse 302 is blown, the supply voltage is increased such that the input gates of the comparator transistors M3 and M4 shown in FIG. 8 may experience a large enough transition voltage to harm the gate oxide. The PMOS devices 902 turn-off when the fuse 302 is being blown, therefore isolating the high voltage from any gate oxide.

Figure 10:
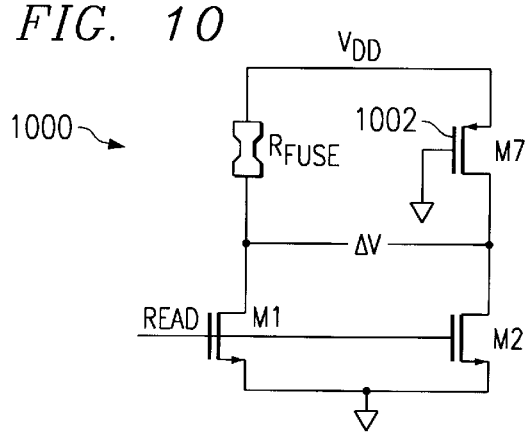
FIG. 10 is a schematic diagram illustrating a resistance bridge having only a PMOS device in the sensing leg of the bridge according to another embodiment of the present invention and that is suitable for use with the difference voltage sensing circuit depicted in FIG. 8.

FIG. 10 illustrates a differential voltage sense circuit resistance bridge 1000 according to another embodiment of the present invention. Those skilled in the art will appreciate that resistor 304 in differential voltage sense circuit 800 can be replaced with the PMOS transistor 1002 having a narrow width and a long channel to retain the requisite resistor characteristics. Parametric variations will of course be much higher for a differential voltage sense circuit using the bridge 1000 when compared with use of a bridge using a resistor 304 constructed from poly silicon or N-well silicon, as discussed herein before. More care must therefore be taken in the design of the comparator/latch 702, 704 that senses the delta voltage 307.

FIG. 11(*a*) illustrates a differential voltage sense circuit resistance bridge 1100 comprising a structure 1102 to lower the value of the impedance in the sense arm of the bridge 1100 according to one embodiment of the present invention. The present inventors recognized that although factory testing can be implemented to detect the state of a blown fuse for a given differential voltage sense circuit, aging characteristics associated with fuse values may cause the sense circuit to fail over time. Also, the operational conditions in the field may be degraded such as decreased supply voltage or elevated temperature that can not be completely tested for at the factory. The PMOS transistor 1104 is used to lower the value of the impedance 1106 in the sense arm of the bridge 1100. Deployment of the structure 1102 would be as follows: During testing at the factory, PMOS device 1104 is turned "OFF" and the fuse 302 is determined to be blown with a larger value for impedance 1106. This means that the resistance of fuse 302 is much larger than that of impedance 1106. In the field, a MARGIN signal 1108 is generated causing PMOS transistor 1104 to reduce the value of impedance 1106 such that it further deviates from the fuse 302 resistance value. In this way, the resistance value of the fuse 302 can "regrow" a defined amount while permitting the differential voltage sense circuit to remain functional. This modification also covers the changes in environmental conditions and allows for continued functional operation of the circuit.

FIG. 11(*b*) illustrates a differential voltage sense circuit resistance bridge 1200 comprising a structure 1202 to lower the value of the impedance in the sense arm of the bridge according to another embodiment of the present invention. The bridge 1200 functions similar to the bridge described above with reference to FIG. 11(*a*), except a PMOS device 1204 operates as the impedance setting device in the sensing arm of the resistance bridge 1200.

Of course the circuit is described as a bridge with the fuse and sense resistor in the upper arms, but clearly this idea is the same if the fuse and sense resistor were in the lower arms and PMOS devices were used as matched resistances for the upper arms of the bridge. The CMOS differential amp/latch would be modified by changing all NMOS transistors to PMOS and visa versa. The logic sense would also be inverted.

In view of the above, it can be seen the present invention presents a significant advancement in the art of sense technology to detect the state of CMOS fuses at low power supply voltages. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A differential voltage sense circuit comprising:
    a resistance bridge having a fused upper leg, a resistive upper leg, a first switched lower leg connected to the fused upper leg and a second switched lower leg connected to the resistive upper leg;
    a comparator operative to sense a voltage difference between the first and second switched lower legs of the resistance bridge where the upper legs join with the lower legs;
    a latch operative to latch voltage state information associated with the voltage difference; and
    a combinational element operative to prevent the switched lower legs of the resistance bridge from turning off until the voltage state information is latched.

2. The differential voltage sense circuit according to claim 1 wherein the fused upper leg comprises a poly silicide fuse.

3. The differential voltage sense circuit according to claim 1 wherein the resistive upper leg comprises a CMOS process doped silicon N-well.

4. The differential voltage sense circuit according to claim 1 wherein the resistive upper leg comprises a CMOS process doped silicon P-well.

5. The differential voltage sense circuit according to claim 1 wherein the resistive upper leg comprises a poly silicide resistor.

6. The differential voltage sense circuit according to claim 1 wherein the comparator is further operative to sense the voltage difference in response to a read signal.

7. The differential voltage sense circuit according to claim 1 wherein the combinational element is a NOR gate.

8. The differential voltage sense circuit according to claim 1 wherein the resistance bridge, comparator, latch and combinational element are compatible with deep sub-micron CMOS processes.

9. The differential voltage sense circuit according to claim 1 wherein each lower leg of the resistance bridge further comprises an isolation device operational to isolate high switching voltage levels from the comparator.

10. The differential voltage sense circuit according to claim 1 wherein the resistive upper leg of the resistance bridge comprises solely a CMOS transistor.

11. The differential voltage sense circuit according to claim 1 wherein the resistive upper leg of the resistance bridge comprises solely a resistor.

12. The differential voltage sense circuit according to claim 1 wherein the resistive upper leg of the resistance bridge comprises a controlled impedance.

13. The differential voltage sense circuit according to claim 12 wherein the controlled impedance comprises a resistor and a CMOS transistor operational to vary the impedance of the resistor in response to a margin signal.

14. The differential voltage sense circuit according to claim 12 wherein the controlled impedance comprises a first CMOS transistor configured as a resistor and a second CMOS transistor operational to vary the impedance of the first CMOS transistor in response to a margin signal.

15. A differential voltage sense circuit comprising:
    a resistance bridge having a fuse in one upper leg, a sense element in its other upper leg, and a switch in each lower leg, the upper legs connected to a common supply voltage, wherein the bridge is operative to generate a differential voltage in response to a switch input signal common to both switches that causes current to flow through both switches, the fuse and the sense element, wherein the differential voltage has a polarity that provides fuse status information; and
    a latch operative to store the fuse status information.

16. The differential voltage sense circuit according to claim 15 further comprising a comparator operational to sense the differential voltage and generate the fuse status information in response to an input signal that initiates the switch input signal.

17. The differential voltage sense circuit according to claim 16 wherein the resistance bridge, comparator, and latch are capable of operating at a supply voltage compatible with deep sub-micron CMOS processes.

18. The differential voltage sense circuit according to claim 16 further comprising a combinational element operational to cause the switch current to flow until the fuse status information is latched.

19. The differential voltage sense circuit according to claim 18 wherein the combinational element is a NOR gate.

20. The differential voltage sense circuit according to claim 18 wherein the resistance bridge, comparator, latch and combinational element are capable of operating at a supply voltage compatible with deep sub-micron CMOS processes.

21. The differential voltage sense circuit according to claim 15 wherein the fuse comprises a silicide poly fuse.

22. The differential voltage sense circuit according to claim 15 wherein the sense element comprises a silicide poly resistor.

23. The differential voltage sense circuit according to claim 15 wherein the sense element comprises a CMOS process doped silicon N-well.

24. The differential voltage sense circuit according to claim 15 wherein the sense element comprises a CMOS process doped silicon P-well.

25. The differential voltage sense circuit according to claim 16 wherein each lower leg of the resistance bridge further comprises an isolation device operational to isolate high switching voltage levels from the comparator.

26. The differential voltage sense circuit according to claim 15 wherein the sense element comprises solely a CMOS transistor.

27. The differential voltage sense circuit according to claim 15 wherein the sense element comprises solely a resistor.

28. The differential voltage sense circuit according to claim 15 wherein the sense element comprises solely a controlled impedance.

29. The differential voltage sense circuit according to claim 28 wherein the controlled impedance comprises a resistor and a CMOS transistor operational to vary the impedance of the sense element in response to a margin signal.

30. The differential voltage sense circuit according to claim 28 wherein the controlled impedance comprises a first CMOS transistor configured as an impedance device and a second CMOS transistor operational to vary the impedance of the first CMOS transistor in response to a margin signal.

31. A differential voltage sense circuit comprising:
- a resistance bridge having at least one fused leg connected to a supply voltage;
- means for sensing a voltage difference associated with the resistance bridge, wherein the voltage difference has a polarity that is indicative of fuse status information; and
- means for latching the fuse status information.

32. The differential voltage sense circuit according to claim 31 wherein the at least one fused leg comprises a silicide poly fuse.

33. The differential voltage sense circuit according to claim 31 wherein the resistance bridge further has a sense leg connected to the supply voltage.

34. The differential voltage sense circuit according to claim 33 wherein the sense leg comprises a silicide poly resistor.

35. The differential voltage sense circuit according to claim 33 wherein the sense leg comprises a controlled impedance.

36. The differential voltage sense circuit according to claim 35 wherein the controlled impedance comprises a resistor and a CMOS transistor operational to vary the impedance of the sense element in response to a control signal.

37. The differential voltage sense circuit according to claim 35 wherein the controlled impedance comprises a first CMOS transistor configured as an impedance device and a second CMOS transistor operational to vary the impedance of the first CMOS transistor in response to a control signal.

38. The differential voltage sense circuit according to claim 33 wherein the resistance bridge further has a pair of switch element legs connected to a common ground.

39. The differential voltage sense circuit according to claim 38 wherein the at least one fused leg comprises a silicide poly fuse.

40. The differential voltage sense circuit according to claim 39 wherein each switch element leg comprises a CMOS switch, wherein the CMOS switches have matching switching characteristics.

41. The differential voltage sense circuit according to claim 40 wherein each switch element leg of the resistance bridge further comprises an isolation device operational to isolate high switching voltage levels from the sensing means.

42. The differential voltage sense circuit according to claim 31 wherein the sensing means comprises a voltage comparator.

43. The differential voltage sense circuit according to claim 31 further comprising a combinational element operative to maintain the voltage difference until the fuse status information is latched.

44. The differential voltage sense circuit according to claim 43 wherein the combinational element is a NOR gate.

45. A method of determining CMOS process compatible fuse status information comprising the steps of:
(a) providing a voltage supply having a voltage compatible with deep sub-micron CMOS processes;
(b) providing a resistance bridge connected to the supply voltage and having a fuse in at least one leg of the resistance bridge;
(c) generating a voltage difference between two legs of the resistance bridge such that a polarity associated with the voltage difference provides fuse status information in response to a first input signal; and
(d) latching the fuse status information.

46. The method according to claim 45 further comprising the step of sensing the voltage difference in response to a second input signal and generating the fuse status information therefrom prior to latching the fuse status information.

47. The method according to claim 46 further comprising the step of sensing the latched fuse status information and generating the first input signal therefrom.

48. The method according to claim 47 further comprising the step of removing the first input signal such that current no longer flows in the resistance bridge subsequent to latching the fuse status information.

49. A differential voltage sense circuit comprising:
- a resistance bridge having at least one fused leg connected to a supply voltage;
- a sense leg connected to the supply voltage, the sense leg comprising a controlled impedance, wherein the controlled impedance comprises a resistor and a CMOS transistor operational to vary the impedance of the sense leg in response to a control signal;
- means for sensing a voltage difference associated with the resistance bridge, wherein the voltage difference has a polarity that is indicative of fuse status information; and
- means for latching the fuse status information.

50. The differential voltage sense circuit according to claim 49 wherein the at least one fused leg comprises a silicide poly fuse.

51. The differential voltage sense circuit according to claim 50 wherein the sense leg resistor comprises a silicide poly resistor.

52. The differential voltage sense circuit according to claim 49 wherein the at least one fused leg comprises a silicide poly fuse.

53. The differential voltage sense circuit according to claim 49 wherein the resistance bridge further has a pair of switch element legs connected to a common ground.

54. The differential voltage sense circuit according to claim 53 wherein each switch element leg comprises a CMOS switch, wherein the CMOS switches have matching switching characteristics.

55. The differential voltage sense circuit according to claim 54 wherein each switch element leg of the resistance bridge further comprises an isolation device operational to isolate high switching voltage levels from the sensing means.

56. The differential voltage sense circuit according to claim 49 wherein the sensing means comprises a voltage comparator.

57. The differential voltage sense circuit according to claim 49 further comprising a combinational element operative to maintain the voltage difference until the fuse status information is latched.

58. The differential voltage sense circuit according to claim 43 wherein the combinational element is a NOR gate.

59. A differential voltage sense circuit comprising:
- a resistance bridge having at least one fused leg connected to a supply voltage;
- means for sensing a voltage difference associated with the resistance bridge, wherein the voltage difference has a polarity that is indicative of fuse status information;
- means for latching the fuse status information; and a combinational element operative to maintain the voltage difference until the fuse status information is latched.

60. The differential voltage sense circuit according to claim 59 wherein the at least one fused leg comprises a silicide poly fuse.

61. The differential voltage sense circuit according to claim 59 wherein the resistance bridge further has a sense leg connected to the supply voltage.

62. The differential voltage sense circuit according to claim 61 wherein the sense leg comprises a silicide poly resistor.

63. The differential voltage sense circuit according to claim 61 wherein the sense leg comprises a controlled impedance.

64. The differential voltage sense circuit according to claim 63 wherein the controlled impedance comprises a resistor and a CMOS transistor operational to vary the impedance of the sense element in response to a control signal.

65. The differential voltage sense circuit according to claim 63 wherein the controlled impedance comprises a first CMOS transistor configured as an impedance device and a second CMOS transistor operational to vary the impedance of the first CMOS transistor in response to a control signal.

66. The differential voltage sense circuit according to claim 61 wherein the resistance bridge further has a pair of switch element legs connected to a common ground.

67. The differential voltage sense circuit according to claim 66 wherein the at least one fused leg comprises a silicide poly fuse.

68. The differential voltage sense circuit according to claim 66 wherein each switch element leg comprises a CMOS switch, wherein the CMOS switches have matching switching characteristics.

69. The differential voltage sense circuit according to claim 68 wherein each switch element leg of the resistance bridge further comprises an isolation device operational to isolate high switching voltage levels from the sensing means.

70. The differential voltage sense circuit according to claim 59 wherein the sensing means comprises a voltage comparator.

71. The differential voltage sense circuit according to claim 59 wherein the combinational element comprises a NOR gate.

* * * * *